United States Patent
Chang

(10) Patent No.: US 12,532,776 B2
(45) Date of Patent: Jan. 20, 2026

(54) SEMICONDUCTOR PACKAGE INCLUDING SoIC DIE STACKS

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 643 days.

(21) Appl. No.: 17/714,147

(22) Filed: Apr. 6, 2022

(65) Prior Publication Data
US 2023/0326888 A1    Oct. 12, 2023

(51) Int. Cl.
*H01L 25/065*    (2023.01)
*H01L 23/00*    (2006.01)
*H01L 25/00*    (2006.01)
*H01L 25/10*    (2006.01)

(52) U.S. Cl.
CPC .............. *H01L 24/08* (2013.01); *H01L 24/80* (2013.01); *H01L 25/0657* (2013.01); *H01L 25/105* (2013.01); *H01L 25/50* (2013.01); *H01L 2224/08145* (2013.01); *H01L 2224/80895* (2013.01); *H01L 2224/80896* (2013.01)

(58) Field of Classification Search
CPC . H01L 25/0657; H01L 25/0652; H01L 24/08; H01L 2224/08145; H01L 23/31
See application file for complete search history.

(56) References Cited

U.S. PATENT DOCUMENTS

| | | | |
|---|---|---|---|
| 2014/0346671 A1* | 11/2014 | Yu | H01L 21/6836 257/737 |
| 2021/0024932 A1 | 1/2021 | Freedman et al. | |
| 2021/0028146 A1* | 1/2021 | Lee | H01L 21/565 |
| 2022/0310470 A1* | 9/2022 | Chen | H01L 27/0688 |
| 2022/0328467 A1* | 10/2022 | Chen | H01L 25/18 |

FOREIGN PATENT DOCUMENTS

| | | |
|---|---|---|
| CN | 114267645 A | 4/2022 |
| TW | 201911494 A | 3/2019 |
| TW | 202137475 A | 10/2021 |

OTHER PUBLICATIONS

Office Action received in the corresponding Taiwan application 112105533, mailed Oct. 13, 2023, 9 pages.

* cited by examiner

*Primary Examiner* — Thanh Y. Tran
(74) *Attorney, Agent, or Firm* — Kilpatrick Townsend & Stockton LLP

(57) ABSTRACT

A semiconductor package is provided. The semiconductor package includes: an interposer; a System on Integrated Chips (SoIC) die stack bonded to a top surface of the interposer, the SoIC die stack comprising two or more dies bonded together; and a plurality of chips bonded to the top surface of the interposer. A first lateral distance, in a first direction, between a first boundary of the SoIC die stack and a boundary of a neighboring chip among the plurality of chips is larger than a first threshold distance.

20 Claims, 10 Drawing Sheets

SEMICONDUCTOR PACKAGE INCLUDING SoIC DIE STACKS

FIELD

Embodiments of the present disclosure relate generally to semiconductor packaging, and more particularly to design rule check for a semiconductor package including die stacks.

BACKGROUND

In recent years, the semiconductor industry has experienced rapid growth due to continuous improvement in the integration density of a variety of electronic components (e.g., transistors, diodes, resistors, capacitors, etc.). For the most part, improvement in integration density has resulted from iterative reduction of minimum feature size, which allows more components to be integrated into a given area.

These continuously scaled electronic components require smaller packages that occupy less area than previous packages. Exemplary types of packages include quad flat pack (QFP), pin grid array (PGA), ball grid array (BGA), flip chips (FC), three-dimensional integrated circuits (3D ICs), wafer-level packages (WLPs), and package on package (PoP) devices. For instance, front-end 3D inter-chip stacking technologies are used for re-integration of chiplets partitioned from System on Chip (SoC). The resulting integrated chip outperforms the original SoC in system performance. It also affords the flexibility to integrate additional system functionalities. Advantages of those advanced packaging technologies like 3D inter-chip stacking technologies include improved integration density, faster speeds, and higher bandwidth because of the decreased length of interconnects between the stacked chips. However, there are quite a few challenges to be handled for the technologies of advanced packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
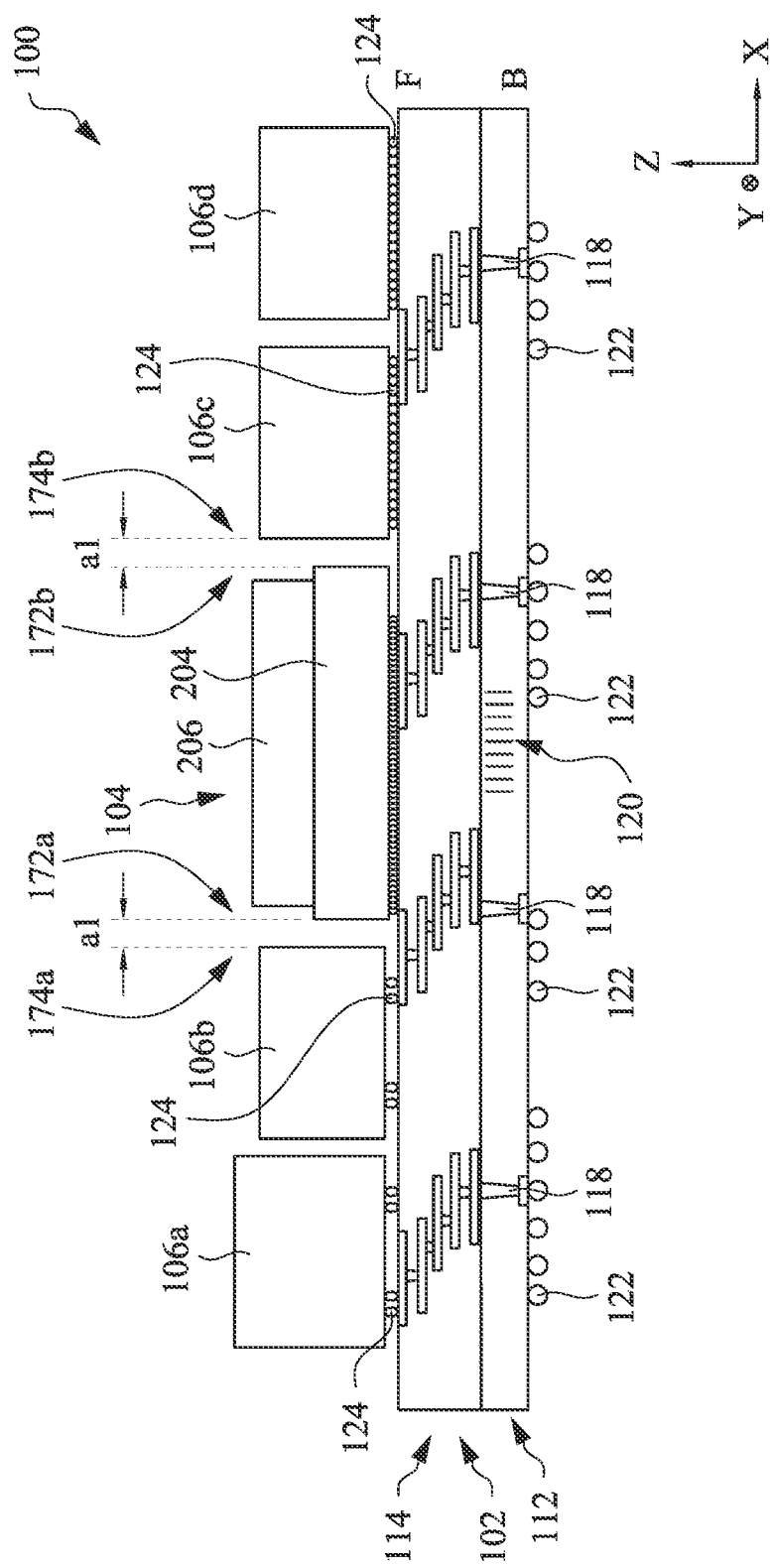
FIG. 1 is a schematic diagram illustrating an example semiconductor package in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Packaging technologies were once considered just back-end processes, almost an inconvenience. Times have changed. Computing workloads have evolved more over the past decade than perhaps the previous four decades. Cloud computing, big data analytics, artificial intelligence (AI), neural network training, AI inferencing, mobile computing on advanced smartphones, and even self-driving cars are all pushing the computing envelope. Modern workloads have brought packaging technologies to the forefront of innovation, and they are critical to a product's performance, function, and cost. These modern workloads have pushed the product design to embrace a more holistic approach for optimization at the system level.

Chip-on-Wafer-on-Substrate (CoWoS) is a wafer-level multi-chip packaging technology. CoWoS is a packaging technology that incorporates multiple chips side-by-side on a silicon interposer in order to achieve better interconnect density and performance. Individual chips are bonded through, for example, micro-bumps on a silicon interposer, forming a chip-on-wafer (CoW) structure. The CoW structure is then subsequently thinner such that through-silicon-vias (TSVs) are exposed, which is followed by the formation of bumps (e.g., C4 bumps) and singulation. The CoW structure is then bonded to a package substrate forming the CoWoS structure. Since multiple chips or dies are generally incorporated in a side-by-side manner, the CoWoS is considered a 2.5-dimensional (2.5D) wafer-level packaging technology.

On the other hand, those multiple chips that are bonded to the interposer in a CoWoS structure can each include stacking dies or chiplets (i.e., modular dies), with multi-layers, multi-chip sizes, and multi-functions. In one implementation, the stacking dies are bonded together using hybrid bonding (HB). Hybrid bonding is a process that stacks and bonds dies using both dielectric bonding layers and metal-to-metal interconnects in advanced packaging. Since no bumps like micro-bumps are used, hybrid bonding is regarded as a bumpless bonding technique. Hybrid bonding can provide improved integration density, faster speeds, and higher bandwidth. In addition to die-to-die bonding, hybrid bonding can also be used for wafer-to-wafer bonding and die-to-wafer bonding. In another implementation, the stacking dies are bonded together using fusion bonding.

Stacking dies featuring ultra-high-density-vertical-stacking (often using hybrid bonding) is sometimes referred to System on Integrated Chips (SoIC) technologies. SoIC technologies can achieve high performance, low power, and minimum resistance-inductance-capacitance (RLC). SoIC technologies integrate active and passive chips that are partitioned from System on Chip (SoC), into a new integrated SoC system, which is electrically identical to native SoC, to achieve better form factor and performance. A die stack bonded together using hybrid bonding is sometimes, therefore, referred to as a SoIC die stack ("SoIC die stack" and "die stack" are used interchangeably throughout the disclosure).

Since SoIC die stack is bonded using hybrid bonding or fusion bonding, the bonding force at the interface between two dies may not be as strong as that for other bonding techniques. As a result, the stacking interface between two dies may, partially or even entirely, become loose, and the interfacing dies may be detached from each other, when subjected to external impacts. This phenomenon is sometimes also referred to as chip delamination. Chip delamination would result in an open circuit or defective structure between the two dies.

In accordance with some aspects of the disclosure, various semiconductor packages and a method of design rule check for a SoIC die stack are provided. SoIC die stack data is obtained. The SoIC die stack data is information on the SoIC die stack and may include one or more of the following aspects: (i) the number of dies bonded together; (ii) dimensions of each die; (iii) bonding techniques (e.g., hybrid bonding, fusion bonding, etc.) used; (iv) dimensions of the SoIC die stack; and (v) spatial relationship between the SoIC die stack and the semiconductor package.

The spatial relationship between the SoIC die stack and the semiconductor package may include one or more of the following parameters: (i) a first lateral distance, in a first direction, between a first boundary of the SoIC die stack and a boundary of a neighboring chip; (ii) a second lateral distance, in the first direction, between a second boundary of the SoIC die stack and a boundary of the interposer; (iii) a third lateral distance, in the first direction, between the second boundary of the SoIC die stack and a boundary of the first package substrate; and (iv) a fourth lateral distance, in the first direction, between the second boundary of the SoIC die stack and a boundary of the second package substrate. During design rule check for the SoIC die stack, it is determined whether the first lateral distance is larger than a first threshold distance, whether the second lateral distance is larger than a second threshold distance, whether the third lateral distance is larger than a third threshold distance, whether the fourth lateral distance is equal to or larger than the fourth threshold distance. If all these individual rules are satisfied, the SoIC die stack passes the design rule check. Otherwise, the SoIC die stack fails the design rule check, and a design rule violation report may be generated accordingly.

By setting the first, second, third, and fourth lateral distances larger than certain thresholds, the chances of having a collision with the neighboring components or external components are significantly reduced, therefore preventing chip lamination from happening. Details of those lateral distances, corresponding threshold distances, the method of design rule check will be described below with reference to FIGS. 1-9.

FIG. 1 is a schematic diagram illustrating an example semiconductor package 100 in accordance with some embodiments. In the example shown in FIG. 1, the semiconductor package 100 includes an interposer 102, a SoIC die stack 104, and multiple chips 106a-106d, among other components. The SoIC die stack 104 and the multiple chips 106a-106d are located on and bonded to the top surface of the interposer 102 in the vertical direction (i.e., the Z-direction, as shown in FIG. 1). The SoIC die stack 104 and the multiple chips 106a-106d are located at various locations in the horizontal plane (i.e., the X-Y plane, as shown in FIG. 1) in a sis-by-side manner. In other words, the semiconductor package 100 is a CoW structure, which could be bonded to a package substrate to form a CoWoS structure, which is mentioned above.

The interposer 102 provides an interface circuit between the package substrate, which may be bonded to a printed circuit board (PCB), and one or more of the SoIC die stack 104 and the multiple chips 106a-106d. In the example shown in FIG. 1, the interposer 102 includes a substrate section 112 and an interposer multilayer interconnect (MLI) structure 114. The substrate section 112 includes one or more through-silicon vias (TSVs) 118 through the substrate section 112. In the example shown in FIG. 1, multiple deep trench capacitors 120 are located in the substrate section 112 and can add capacitance to the SoIC die stack 104 and the chips 106a-106d.

The interposer MLI structure 114 includes a combination of dielectric layers and conductive layers configured to form various interconnect structures. The conductive layers are configured to form vertical interconnect features (e.g., vias, etc.) and horizontal interconnect features (e.g., conductive lines extending in the X-Y plane). Vertical interconnect features typically connect horizontal interconnect features in different layers (e.g., a first metal layer often denoted as "M1" and a fifth metal layer often denoted as "M5") of the interposer MLI structure 114. The interposer MLI structure 114 is configured to route signals and/or distribute signals (e.g., clock signals, voltage signals, ground signals) to one or more of the SoIC die stack 104 and the chips 106a-106d. It should be understood that although the interposer MLI structure 114 is depicted in FIG. 1 with a given number of dielectric layers and conductive layers, the present disclosure contemplates interposer MLI structures having more or fewer dielectric layers and/or conductive layers depending on design requirements.

In addition, the interposer 102 shown in FIG. 1 also includes C4 copper bumps 122 and micro-bumps (i.e., µBumps) 124. At the back side (denoted as "B" in FIG. 1) of the interposer 102, the C4 copper bumps are used to bond the interposer 102 to a package substrate. It should be understood that C4 copper bumps are exemplary rather than limiting, and other types of bonding techniques may be employed in other implementations. Each of the TSVs 118 is electrically connected to at least one C4 copper bump 122.

At the front side (denoted as "F" in FIG. 1) of the interposer 102, the micro-bumps 124 are used to bond the chips 106a-106d to the interposer 102. It should be understood that micro-bumps are exemplary rather than limiting, and other types of bonding techniques may be employed in other implementations. As to the interface between the interposer 102 and the SoIC die stack 104, the SoIC die stack 104 can be bonded to the interposer 102 using hybrid bonding in one implementation. In other implementations, the SoIC die stack 104 can be bonded to the interposer 102 using other bonding techniques such as micro-bumps and fusion bonding.

As a result, a package substrate can be electrically connected to one or more of the SoIC die stack 104 and the chips 106a-106d through the interposer 102. An exemplary electrical path includes the C4 copper bump 122, the TSV 118, the interposer MLI structure 114, and the micro-bump 124.

The chips 106a-106d are independent chips, which fulfill various functions. Each of the chips 106a-106d is one of, for example, a logic chip, a memory chip, a computation chip, a sensor chip, a radio frequency (RF) chip, a high voltage (HV) chip, and the like.

Figure 2:
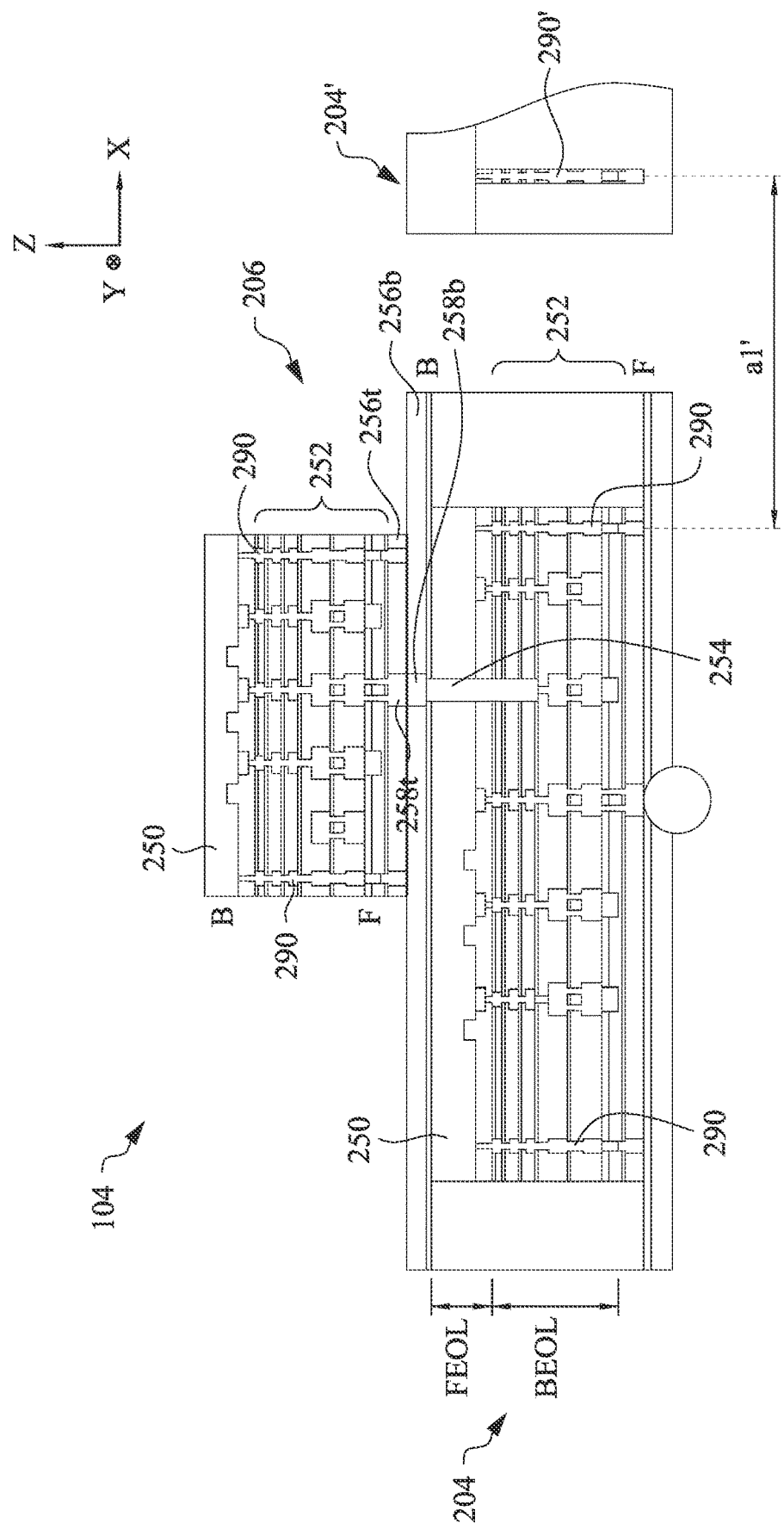
FIG. 2 is a diagram illustrating the SoIC die stack 104 shown in FIG. 1 in accordance with some embodiments.

In the example shown in FIG. 1, the SoIC die stack 104 includes a bottom die 204 and a top die 206. FIG. 2 is a diagram illustrating the SoIC die stack 104 shown in FIG. 1 in accordance with some embodiments. In the example shown in FIG. 2, the bottom die 204 has a front side (denoted as "F" in FIG. 2) and a back side (denoted as "B" in FIG. 2). In the example shown in FIG. 2, the bottom die 204 has been flipped, i.e., upside down. A bonding layer 256b ("b" stands for "bottom") is formed at the back side and on a silicon substrate 250. In one implementation, the bonding layer 256b is made of a dielectric and can be used for bonding with another bonding layer 256t ("t" stands for "top") at the top die 206.

One or more semiconductor devices (e.g., transistors, resistors, capacitors, inductors, etc.) are formed on the silicon substrate 250, before being flipped, in a front-end-of-line (FEOL) process. A multilayer interconnect (MLI) structure 252 is disposed over the one or more semiconductor devices, before being flipped. The MLI structure 252 includes a combination of dielectric layers and conductive layers configured to form various interconnect structures. The conductive layers are configured to form vertical interconnect features (e.g., device-level contacts, vias, etc.) and horizontal interconnect features (e.g., conductive lines extending in a horizontal plane). Vertical interconnect features typically connect horizontal interconnect features in different layers (e.g., a first metal layer often denoted as "M1" and a fifth metal layer often denoted as "M5") of the MLI structure 252. During operation of bottom die 204, the interconnect structures are configured to route signals and/or distribute signals (e.g., clock signals, voltage signals, ground signals) to the one or more semiconductor devices to fulfill certain functions. It should be understood that although the MLI structure 252 is depicted in FIG. 2 with a given number of dielectric layers and conductive layers, the present disclosure contemplates MLI structures having more or fewer dielectric layers and/or conductive layers depending on design requirements of the bottom die 204.

In the example shown in FIG. 2, the bottom die 204 includes a hybrid bonding metal pad 258b formed in the bonding layer 256b, and the hybrid bonding metal pad 258b is connected to the MLI structure 252 through a through-silicon via (TSV) 254, which penetrates the silicon substrate 250 in the vertical direction (i.e., the Z-direction). It should be understood that although only one hybrid bonding metal pad 258b and a TSV 254 is shown in FIG. 1, this is not intended to be limiting. In other examples, there are many hybrid bonding metal pads 258b and corresponding TSVs 254, with small critical dimensions and pitches, thus achieving better interconnect density and performance (e.g., faster speeds, higher bandwidth, and the like).

A seal ring 290 is a metallization structure that is located between and separates the core circuitry of the bottom die 204 and the peripheral regions (or edges) of the bottom die 204. The seal ring 290 surrounds the core circuitry in the X-Y plane and prevents the intrusion of cracks and moisture penetration or chemical damage like acid, alkaline containing or diffusion of contaminating species.

Likewise, the top die 206 has a front side (denoted as "F" in FIG. 1) and a back side (denoted as "B" in FIG. 1). In the example shown in FIG. 1, the top die 206 has been flipped, i.e., upside down. A bonding layer 256t ("t" stands for "top") is formed at the front side and over a MLI structure 252, before the top die 106 is flipped. In one implementation, the bonding layer 256t is made of a dielectric and can be used for bonding with the bonding layer 256b at the bottom die 204, as mentioned above. Likewise, the top die 206 includes a hybrid bonding metal pad 258t ("t" stands for "top") formed in the bonding layer 256t, and the hybrid bonding metal pad 258t is connected to the MLI structure 252 through, for example, a via. It should be understood that although only one hybrid bonding metal pad 258t and a TSV 154 are shown in FIG. 1, this is not intended to be limiting. In other examples, there are many hybrid bonding metal pads 258t and corresponding TSVs 254, with small critical dimensions and pitches, thus achieving better interconnect density and performance (e.g., faster speeds, higher bandwidth, and the like).

For die-to-die boding, back-end processes, such as dicing, die handling, and die transport on film frame, have to be adapted to front-end clean levels, allowing high bonding yields on a die level. For example, copper hybrid bonding is conducted in a cleanroom in a wafer fab, instead of in an outsourced semiconductor assembly and test (OSAT) facility. Pick-and-place systems are often used to handle dies in the context of die-to-die boding or die-to-wafer boding. A pick-and-place system is an automatic system that can pick a top die and place it onto the bottom die or a host wafer, often in a high-speed manner. It should be understood that although hybrid bonding is illustrated in FIG. 2 as an example, this is not intended to be limiting. Other bonding techniques such as fusion bonding can also be employed to bond the top die 206 and the bottom die 204 to form the SoIC die stack 104.

Moreover, a SoIC die stack may also include more than two dies bonded together. For instance, a SoIC die stack may include three dies, including a top die, a middle die, and a bottom die, that are stacked together. Details of this example will be described below with reference to FIG. 3. In another example, a SoIC die stack may include three dies, including a bottom die and two top dies bonded on the top of the bottom die.

Figure 3:
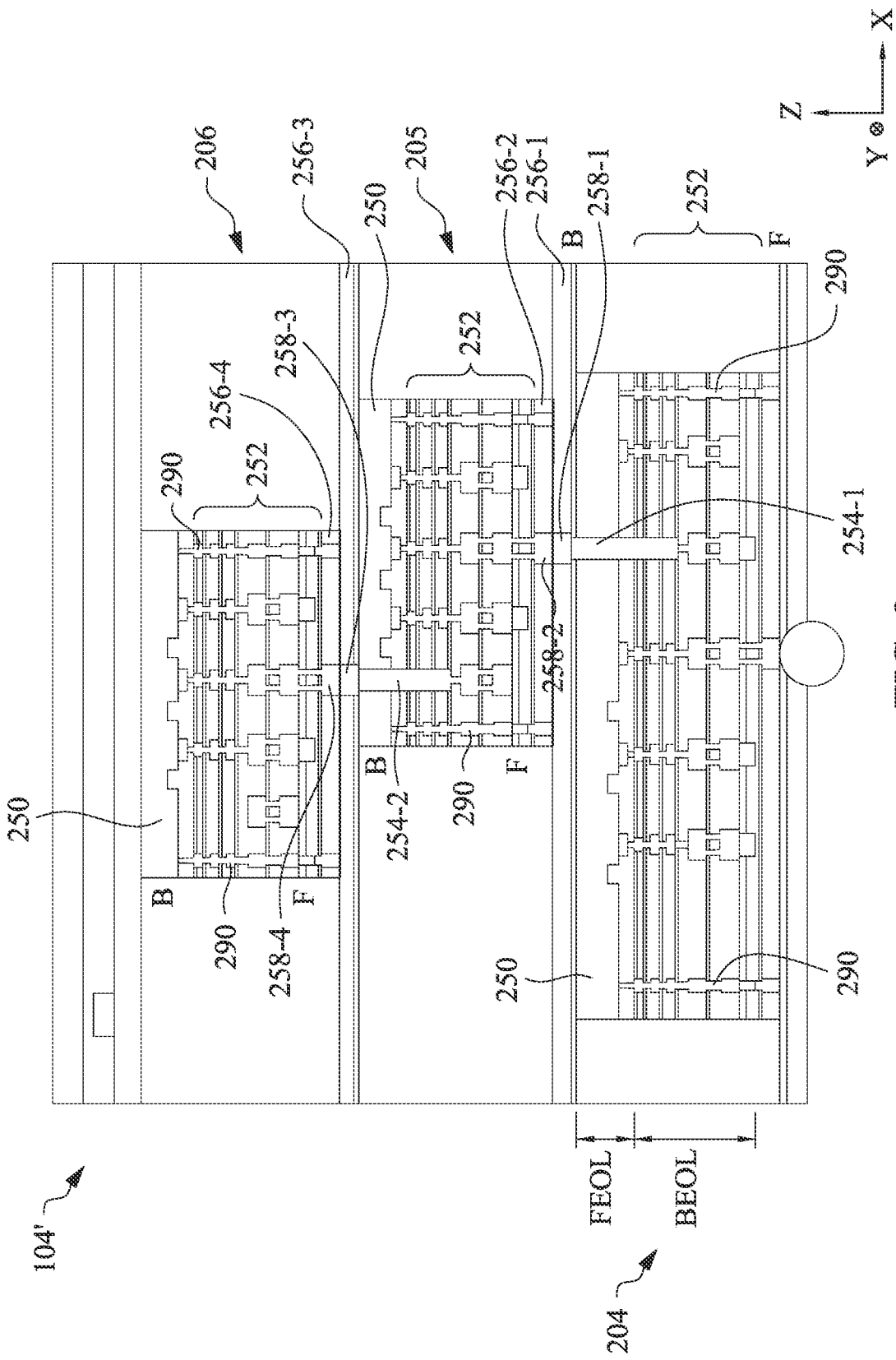
FIG. 3 is a diagram illustrating a SoIC die stack 104' in accordance with some embodiments.

FIG. 3 is a diagram illustrating a SoIC die stack 104' in accordance with some embodiments. In the example shown in FIG. 3, the SoIC die stack 104' include a bottom die 204, a middle die 205, and a top die 206. The middle die 205 is sandwiched between the bottom die 204 and the top die 206. In the example shown in FIG. 3, the bottom die 204, the middle die 205, and the top die 206 are all flipped, i.e., upside down.

The bottom die 204 has a front side (denoted as "F" in FIG. 3) and a back side (denoted as "B" in FIG. 3). A bonding layer 256-1 is formed at the back side and on a silicon substrate 250. In one implementation, the bonding layer 256-1 is made of a dielectric and can be used for bonding with another bonding layer 256-2 at the middle die 205.

In the example shown in FIG. 3, the bottom die 204 includes a hybrid bonding metal pad 258-1 formed in the bonding layer 256-1, and the hybrid bonding metal pad 258-1 is connected to the MLI structure 252 through a through-silicon via (TSV) 254-1, which penetrates the silicon substrate 250 in the vertical direction (i.e., the Z-direction).

Likewise, the middle die 205 has a front side (denoted as "F" in FIG. 3) and a back side (denoted as "B" in FIG. 3). A bonding layer 256-2 is formed at the front side and over a MLI structure 252, before the top die 106 is flipped. In one implementation, the bonding layer 256-2 is made of a dielectric and can be used for bonding with the bonding layer 256-1 at the bottom die 204, as mentioned above. Likewise, the middle die 205 includes a hybrid bonding metal pad 258-2 formed in the bonding layer 256-2, and the hybrid bonding metal pad 258-2 is connected to the MLI structure 252 through, for example, a via.

Another bonding layer 256-3 is formed at the back side and on a silicon substrate 250. In one implementation, the bonding layer 256-3 is made of a dielectric and can be used for bonding with another bonding layer 256-4 at the top die 206. In the example shown in FIG. 3, the middle die 205 includes a hybrid bonding metal pad 258-3 formed in the bonding layer 256-3, and the hybrid bonding metal pad 258-3 is connected to the MLI structure 252 through a through-silicon via (TSV) 254-2 which penetrates the silicon substrate 250 in the vertical direction (i.e., the Z-direction).

Likewise, the top die 206 has a front side and a back side. A bonding layer 256-4 is formed at the front side and over a MLI structure 252, before the top die 106 is flipped. In one implementation, the bonding layer 256-4 is made of a dielectric and can be used for bonding with the bonding layer 256-3 at the middle die 205, as mentioned above.

Referring back to FIG. 1, the SoIC die stack 104 is located between the chips 106b and 106c in the X-direction. As explained above, the stacking interface between the bottom die 204 and the top die 206 may, partially or even entirely, become loose, and the bottom die 204 and the top die 206 may be detached from each other, when subjected to external impacts such as distortion, collision, pressure and stress, and the like. In order to prevent chip delamination from happening to the SoIC die stack 104, some design rules for the SoIC die stack 104 are provided.

One design rule is that the lateral distance between the SoIC die stack 104 and a neighboring component should be larger than a first threshold distance. As shown in FIG. 1, the SoIC die stack is located between the chips 106b and 106c in the X-direction. The lateral distance, which is the distance, in the X-direction, between the left boundary 172a of the SoIC die stack 104 and the right boundary 174a of the chip 106b and the distance between the right boundary 172b of the SoIC die stack 104 and the left boundary 174b of the chip 106c, is denoted as "a1" in FIG. 1. That is, the design rule is that a1 is larger than the first threshold distance. By setting the lateral distance larger than the first threshold distance, the chances of having a collision with the neighboring components are significantly reduced, therefore preventing chip lamination from happening. In one example, the first threshold distance is 25 μm. In another example, the first threshold distance is 30 μm. In yet another example, the first threshold distance is 35 μm.

It should be understood that the neighboring components could be various components in the semiconductor package 100, including but not limited to a monolithic chip (e.g., a memory chip, a logic chip, a SoC chip, etc.), another SoIC die stack with two or more dies bonded together using hybrid bonding or fusion bonding, a chip stack (e.g., high bandwidth memory) bonded by bumps such as microbumps, non-silicon based dies such as SiC-based dies or glass-based dies, other active, passive, or optoelectronic components.

In another implementation, the design rule is that the lateral distance between the seal ring 290 of the SoIC die stack 104 and the seal ring 290' of a neighboring component should be larger than a first threshold distance. As shown in FIG. 2, the lateral distance, which is the distance, in the X-direction, between the seal ring 290 of the SoIC die stack 104 and the seal ring 290' of the neighboring component, is denoted as "a1" in FIG. 2. That is, the design rule is that a1' is larger than the first threshold distance. By setting the lateral distance a1' larger than the first threshold distance, the chances of having a collision with the neighboring components are significantly reduced, therefore preventing chip lamination from happening. In one example, the first threshold distance is 35 μm. In another example, the first threshold distance is 40 μm. In yet another example, the first threshold distance is 45 μm.

Figure 4:
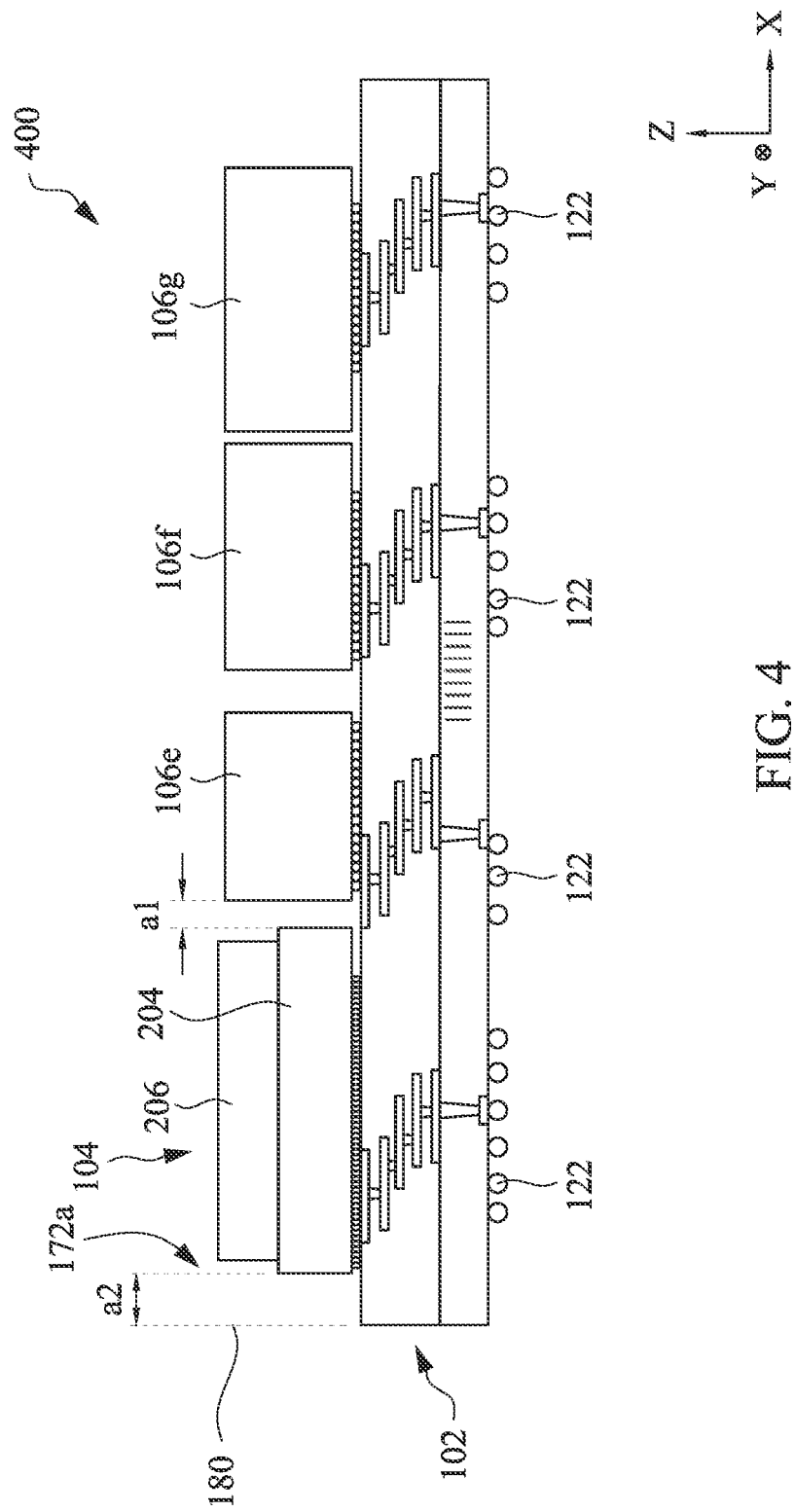
FIG. 4 is a schematic diagram illustrating an example semiconductor package in accordance with some embodiments.

FIG. 4 is a schematic diagram illustrating an example semiconductor package 400 in accordance with some embodiments. The semiconductor package 400 is identical to the semiconductor package 100 shown in FIG. 1 except that the SoIC die stack 104 is located at, in the X-direction, close to the edge 180 of interposer 102 rather than in the middle of the interposer 102. The chips 106e-106g are located to the right of the SoIC die stack 104 in the X-direction. Those identical components in the semiconductor package 400 are not repeated for conciseness.

Since the SoIC die stack is close to the edge 180 of the interposer 102, an additional impact source is impacts or collision from outside the interposer 102 in the X-direction. As a result, another design rule should be followed in addition to the design rule related to a1 or the design rule related to a1'. The design rule is that the lateral distance between the SoIC die stack 104 and an edge 180 of the interposer 102 should be larger than a second threshold distance. As shown in FIG. 4, the lateral distance, which is the distance, in the X-direction, between the left boundary 172a of the SoIC die stack 104 and the edge 180 of the interposer 102, is denoted as "a2" in FIG. 4. That is, the design rule is that a2 is larger than the second threshold distance. By setting the lateral distance a2 larger than the second threshold distance, the chances of having a collision with the components outside the interposer 102 are significantly reduced, therefore preventing chip lamination from happening. In one example, the second threshold distance is 45 µm. In another example, the first threshold distance is 50 µm. In yet another example, the first threshold distance is 55 µm.

In addition, it should be understood that although the interposer 102 is used as an example in FIG. 4, it is not intended to be limiting. The design rule related to a2 can be applied to various configurations where a2 is the lateral distance in the X-direction between the left boundary 172a and an edge 180 of a first base structure that the SoIC die stack 104 is bonded to. In the example shown in FIG. 4, the first base structure is the interposer 102. In other examples, the first base structure may be one of the following structures: a multi-chip module, a multi-chip package, a die stack, a Package on Package (PoP) structure, a Package in Package (PiP) structure, a CoWoS structure, an Integrated Fan-Out (InFO) structure, a System in Package (SiP) structure, a substrate including TSVs, and any substrates that the SoIC die stack 104 is bonded to.

Figure 5:
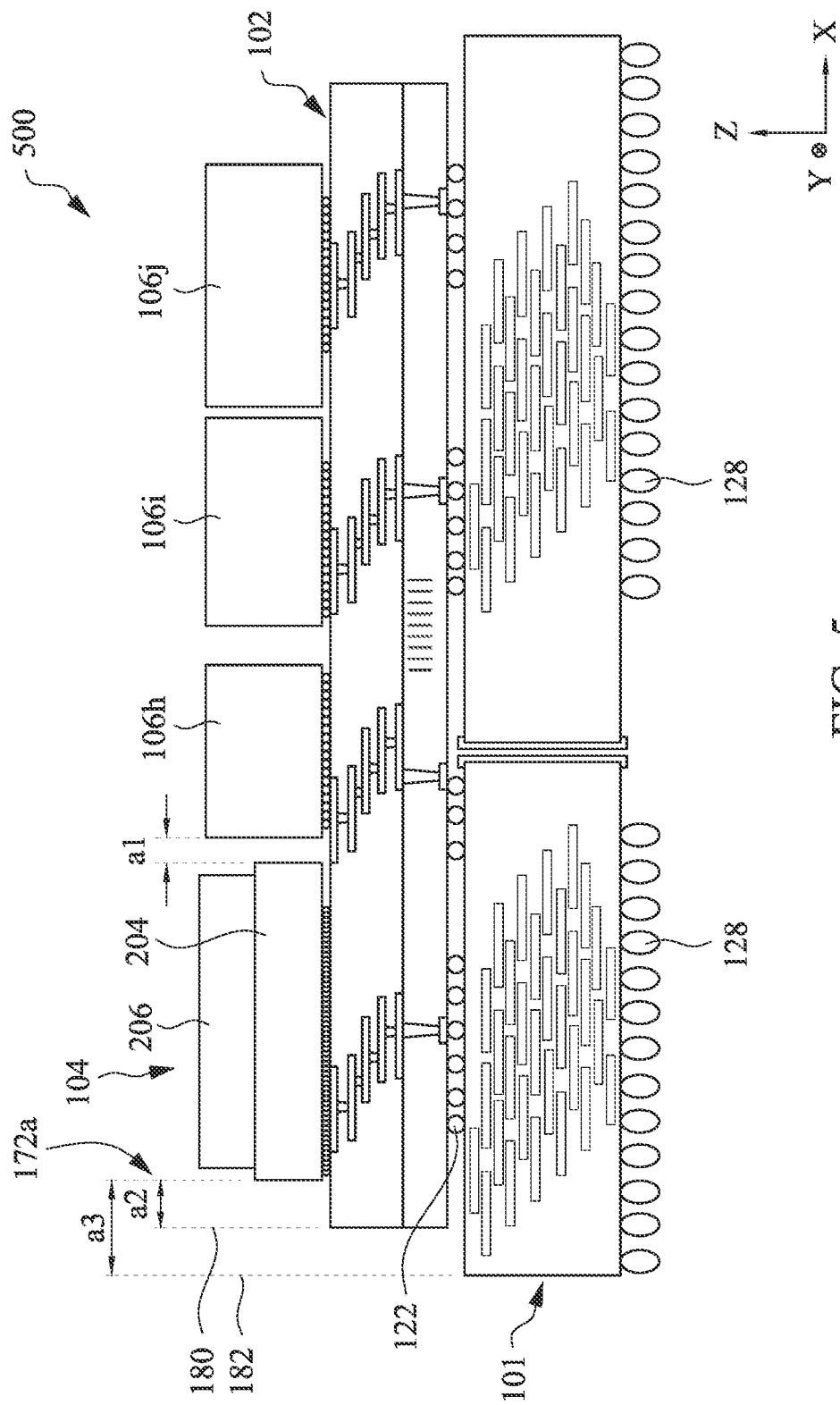
FIG. 5 is a schematic diagram illustrating an example semiconductor package in accordance with some embodiments.

FIG. 5 is a schematic diagram illustrating an example semiconductor package 500 in accordance with some embodiments. The semiconductor package 500 is identical to the semiconductor package 400 shown in FIG. 4 except that the interposer 102 is further attached to a package substrate 101. Those identical components in the semiconductor package 500 are not repeated for conciseness.

The interposer 102 is bonded to the package substrate 101 using C4 copper bumps 122. In some examples, the package substrate 101 can be bonded to a PCB using package balls 128. In other examples, the package substrate 101 can be bonded to a power node of a power source such as a power supply and a ground node of the power source. The package substrate 101 includes interconnect structures that provide electrical connection between the C4 copper bumps 122 on its top surface and the package balls 128 on its bottom surface.

Since the SoIC die stack 104 is close to the edge 182 of the package substrate 101, an additional impact source is impact or collision from outside the package substrate 101 in the X-direction. As a result, another design rule should be followed in addition to the design rule related to a1 (or the design rule related to a1') and the design rule related to a2. The design rule is that the lateral distance between the SoIC die stack 104 and an edge 182 of the package substrate 101 should be larger than a third threshold distance. As shown in FIG. 5, the lateral distance, which is the distance, in the X-direction, between the left boundary 172a of the SoIC die stack 104 and the edge 182 of the package substrate 101, is denoted as "a3" in FIG. 5. That is, the design rule is that a3 is larger than the third threshold distance. By setting the lateral distance a3 larger than the third threshold distance, the chances of having a collision with the components outside the package substrate 101 are significantly reduced, therefore preventing chip lamination from happening. In one example, the third threshold distance is 75 µm. In another example, the third threshold distance is 80 µm. In yet another example, the first threshold distance is 85 µm.

In addition, it should be understood that although the package substrate 101 is used as an example in FIG. 5, it is not intended to be limiting. The design rule related to a3 can be applied to various configurations where a3 is the lateral distance in the X-direction between the left boundary 172a and an edge 182 of a second base structure that the first base structure is bonded to. In other words, the SoIC die stack 104 is bonded to the first base structure, which is bonded to the second base structure. The first base structure is under the SoIC die stack 104, while the second base structure is under the first base structure. In the example shown in FIG. 5, the second base structure is the package substrate 101. In other examples, the second base structure may be one of the following structures: a multi-chip module, a multi-chip package, a die stack, a Package on Package (PoP) structure, a Package in Package (PiP) structure, an Integrated Fan-Out (InFO) structure, a System in Package (SiP) structure, and any substrates that the first base structure is bonded to.

Figure 6:
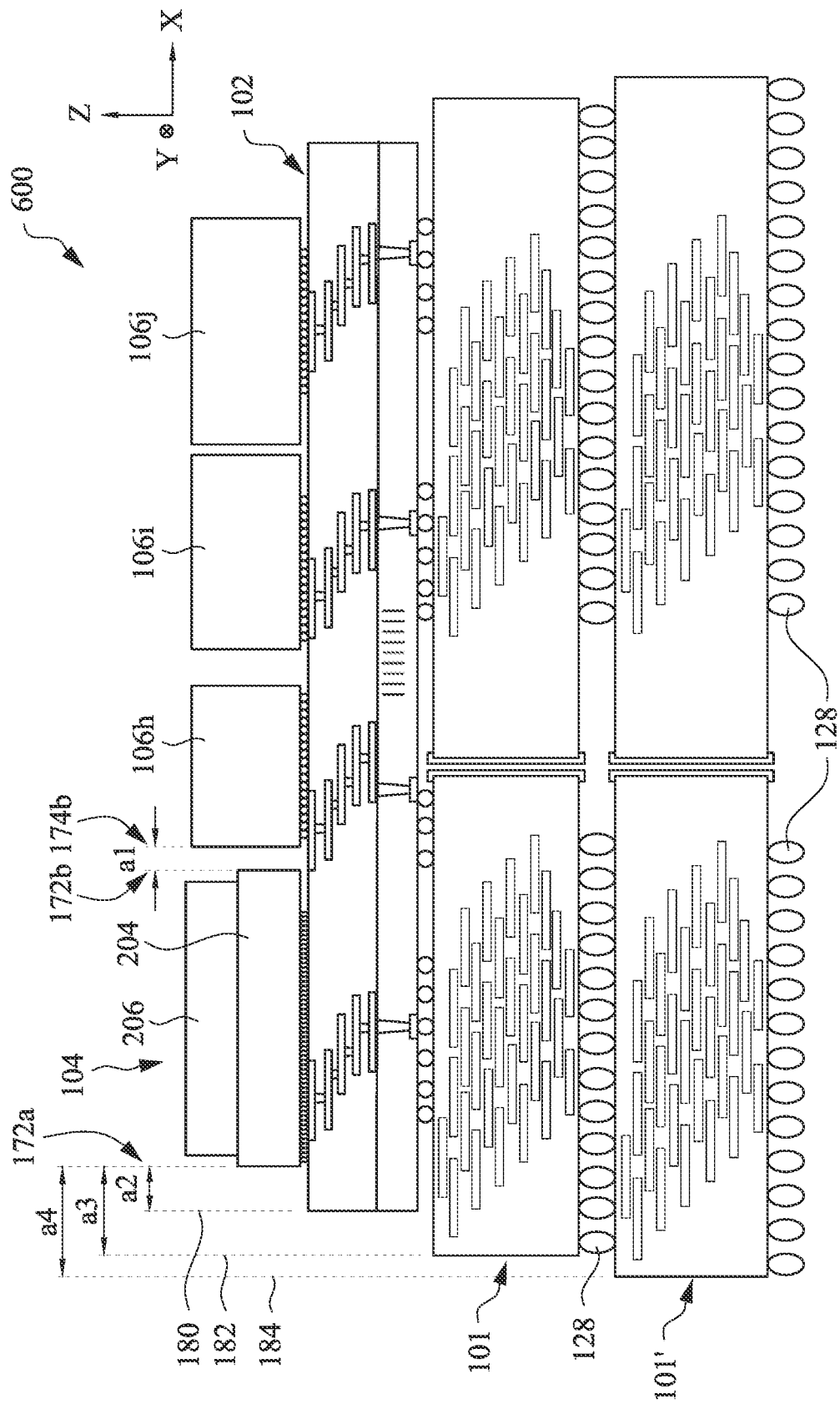
FIG. 6 is a schematic diagram illustrating an example semiconductor package in accordance with some embodiments.

FIG. 6 is a schematic diagram illustrating an example semiconductor package 600 in accordance with some embodiments. The semiconductor package 600 is identical to the semiconductor package 500 shown in FIG. 5 except that the package substrate 101 is further attached to another package substrate 101', which is under the package substrate 101. Those identical components in the semiconductor package 600 are not repeated for conciseness.

The package substrate 101 is bonded to the package substrate 101' using package balls 128. In some examples, the package substrate 101' can be bonded to a PCB. In other examples, the package substrate 101' can be bonded to a power node of a power source such as a power supply and a ground node of the power source. The package substrate 101' includes interconnect structures that provide electrical connection between the package balls 128 on its top surface and the package balls 128 on its bottom surface.

Since the SoIC die stack 104 is close to the edge 184 of the package substrate 101', an additional impact source is impact or collision from outside the package substrate 101' in the X-direction. As a result, another design rule should be followed in addition to the design rule related to a1 (or the design rule related to a1'), the design rule related to a2, and the design rule related to a3. The design rule is that the lateral distance between the SoIC die stack 104 and an edge 184 of the package substrate 101' should be equal to or larger than a3. As shown in FIG. 6, the lateral distance, which is the distance, in the X-direction, between the left boundary 172a of the SoIC die stack 104 and the edge 184 of the package substrate 101', is denoted as "a4" in FIG. 6. That is, the design rule is that a4 is equal to or larger than a3. By setting the lateral distance a4 equal to or larger than a3, the chances of having a collision with the components outside the package substrate 101' are significantly reduced, therefore preventing chip lamination from happening.

In addition, it should be understood that although the package substrate 101' is used as an example in FIG. 6, it is not intended to be limiting. The design rule related to a4 can be applied to various configurations where a4 is the lateral distance in the X-direction between the left boundary 172a and an edge 184 of a third base structure that the second base structure is bonded to. In other words, the SoIC die stack 104 is bonded to the first base structure, which is bonded to the second base structure, which is bonded to the third base structure. The first base structure is under the SoIC die stack 104, the second base structure is under the first base structure, and the third base structure is under the second base structure. In the example shown in FIG. 6, the third base structure is the package substrate 101'. In other examples, the third base structure may be other substrates that the second base structure is bonded to.

Figure 7:
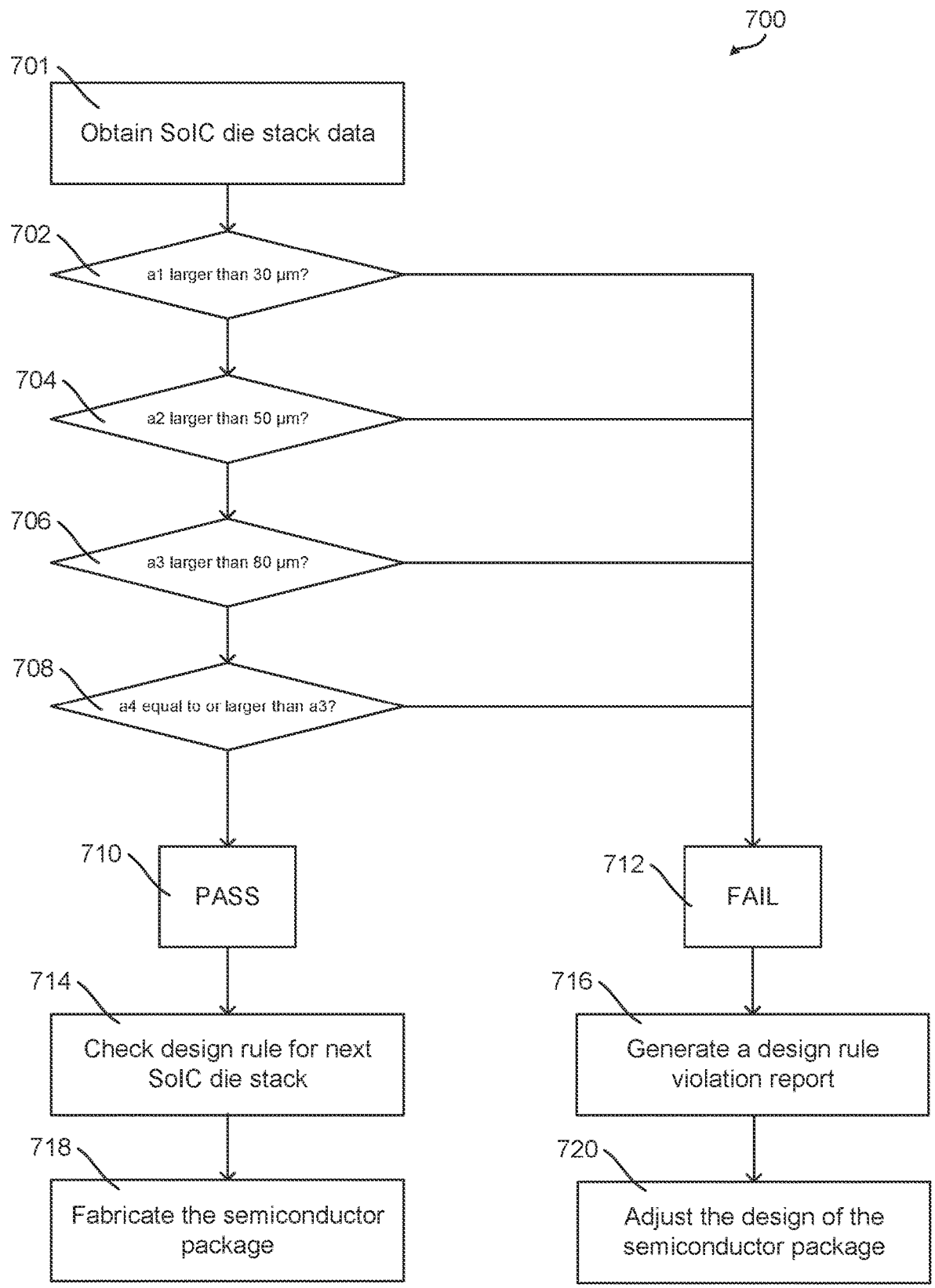
FIG. 7 is a flowchart illustrating an example method of design rule check for an SoIC die stack in accordance to some embodiments.

FIG. 7 is a flowchart illustrating an example method 700 of design rule check for an SoIC die stack in accordance to some embodiments. In the example shown in FIG. 7, the method 700 includes operations 701, 702, 704, 706, 708, 710, 712, 714, 716, 718, and 720. Additional operations may be performed. Also, it should be understood that the sequence of the various operations discussed above with reference to FIG. 7 is provided for illustrative purposes, and as such, other embodiments may utilize different sequences.

For example, operation 704 can be performed before operation 702. These various sequences of operations are to be included within the scope of embodiments.

At operation 701, SoIC die stack data is obtained. The SoIC die stack data is information on the SoIC die stack (e.g., the SoIC die stack 104, as shown in FIG. 1). The SoIC die stack data may include one or more of the following aspects: (i) the number of dies bonded together; (ii) dimensions of each die; (iii) bonding techniques (e.g., hybrid bonding, fusion bonding, etc.) used; (iv) dimensions of the SoIC die stack; and (v) spatial relationship between the SoIC die stack and the semiconductor package (e.g., the semiconductor package 600, as shown in FIG. 6). The spatial relationship between the SoIC die stack and the semiconductor package may include one or more of the following parameters: (i) a1 (or alternatively a1'), as defined above; (ii) a2, as defined above; (iii) a3, as defined above; and (iv) a4, as defined above. Examples of a1, a2, a3, and a4 are illustrated in FIG. 6. The SoIC die stack data is obtained by, for example, a specific purpose system for implementing the method 700 of design rule check for a SoIC die stack, which will be described in detail with reference to FIG. 9.

At operation 702, it is determined whether a1 is larger than a first threshold distance. In one example, the first threshold distance is 30 μm. When a1 is not larger than the first threshold distance, meaning that the SoIC die stack is too close to a neighboring component of the semiconductor package in horizontal directions (e.g., the X-direction and the Y-direction, as shown in FIG. 6), the method 700 proceeds to operation 712, where it is determined that the design rule check is failed. When a1 is larger than the first threshold distance, the method 700 proceeds to operation 704.

At operation 704, it is determined whether a2 is larger than a second threshold distance. In one example, the first threshold distance is 50 μm. When a2 is not larger than the second threshold distance, meaning that the SoIC die stack is too close to an edge of a first base structure (e.g., the interposer 102, as shown in FIG. 6) of the semiconductor package in horizontal directions, the method 700 proceeds to operation 712, where it is determined that the design rule check is failed. When a2 is larger than the first threshold distance, the method 700 proceeds to operation 706.

At operation 706, it is determined whether a3 is larger than a third threshold distance. In one example, the first threshold distance is 80 μm. When a3 is not larger than the third threshold distance, meaning that the SoIC die stack is too close to an edge of a second base structure (e.g., the package substrate 101, as shown in FIG. 6) of the semiconductor package in horizontal directions, the method 700 proceeds to operation 712, where it is determined that the design rule check is failed. When a3 is larger than the third threshold distance, the method 700 proceeds to operation 708.

At operation 708, it is determined whether a4 is equal to or larger than a3. When a4 is smaller than a3, meaning that the SoIC die stack is too close to an edge of a third base structure (e.g., the package substrate 101', as shown in FIG. 6) of the semiconductor package in horizontal directions, the method 700 proceeds to operation 712, where it is determined that the design rule check is failed. When a4 is equal to or larger than a3, the method 700 proceeds to operation 710.

At operation 710, it is determined that design rule check is passed. That is, after every individual design rule checked at operations 702, 704, 706, and 708 has been passed, the design rule check is considered to be passed. Then the method 700 proceeds to operation 714.

At operations 714, the design rule check is carried out for the next SoIC die stack in the semiconductor package. For example, if a semiconductor package has three SoIC die stack, the design rule check is carried out for the first SoIC die stack, the second SoIC die stack, and the third SoIC die stack in sequence.

At operation 718, the semiconductor package including the SoIC die stack(s) are fabricated. One example of the fabrication of the semiconductor package including the SoIC die stack(s) will be described below with reference to FIG. 10.

On the other hand, after it is determined that the design rule check is failed at operation 712, the method 700 proceeds to operation 716. At operation 716, a design rule violation report is generated. The design rule violation report includes information on which individual design rule (e.g., a1 should be larger than the first threshold distance) is violated for which SoIC die stack (e.g., the SoIC die stack 104 shown in FIG. 6). The design rule violation report then can be utilized by a semiconductor package designer or engineer to improve his or her design to prevent chip delamination from happening. In one implementation, the design rule violation report can be visualized in the format of a graphic representation.

At operation 720, the design of the semiconductor package including the SoIC die stack(s) is adjusted. In one implementation, the design of the semiconductor package including the SoIC die stack(s) is adjusted based on the design rule violation report that is generated at operation 716. As such, the semiconductor package designer or engineer can redesign the semiconductor package to make sure the design rules reflected at operations 702-708 are satisfied.

Figure 8A:
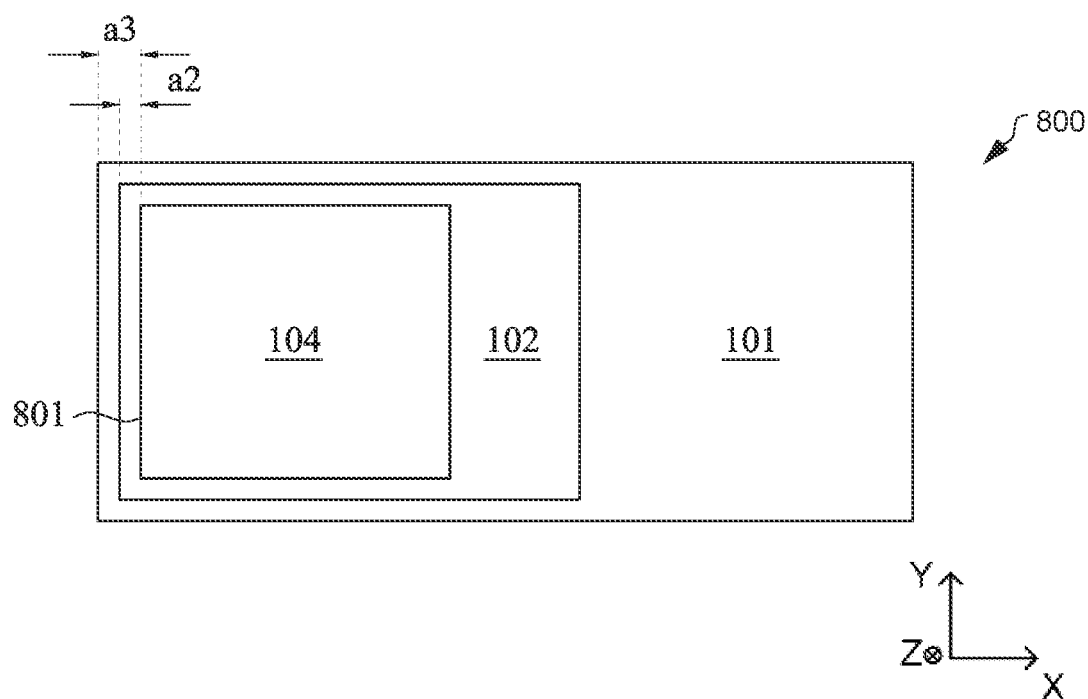
FIG. 8A is a top view of an example semiconductor package in accordance with some embodiments.

FIG. 8A is a top view of an example semiconductor package 800 in accordance with some embodiments. In the example shown in FIG. 8A, a SoIC die stack 104 is on top of a first base structure (e.g., an interposer 102), which is on top of a second base structure (e.g., a package substrate 101). Design rule check is performed against one boundary 801 of the SoIC die stack 104 in the X-direction. It is checked whether a2 is larger than the second threshold distance and whether a3 is larger than the third threshold distance.

Figure 8B:
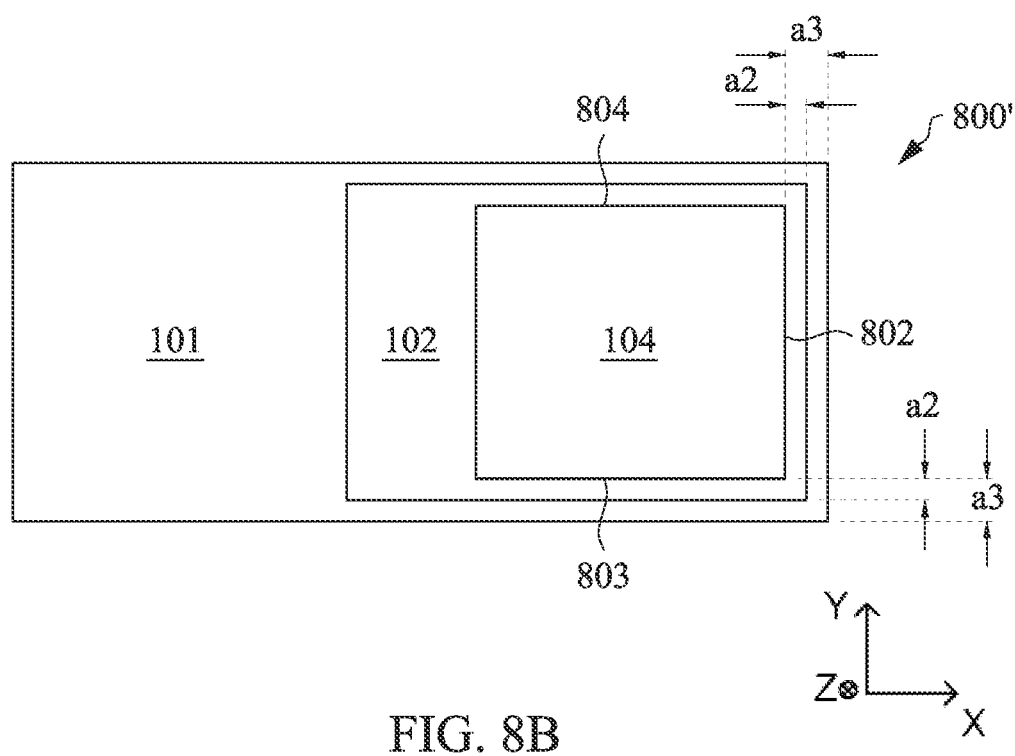
FIG. 8B is a top view of an example semiconductor package in accordance with some embodiments.

FIG. 8B is a top view of an example semiconductor package 800' in accordance with some embodiments. In the example shown in FIG. 8B, a SoIC die stack 104 is on top of a first base structure (e.g., an interposer 102), which is on top of a second base structure (e.g., a package substrate 101). Design rule check is performed against more than one boundary. The design rule check is performed against one boundary 802 of the SoIC die stack 104 in the X-direction. It is checked whether a2 is larger than the second threshold distance and whether a3 is larger than the third threshold distance. In addition, the design rule check is also performed against another boundary 803 of the SoIC die stack 104 in the Y-direction. It is checked whether a2 is larger than the second threshold distance and whether a3 is larger than the third threshold distance. It should be understood that the design rule check can be performed against any combinations of the boundaries of the SoIC die stack 104 in other embodiments.

Figure 9:
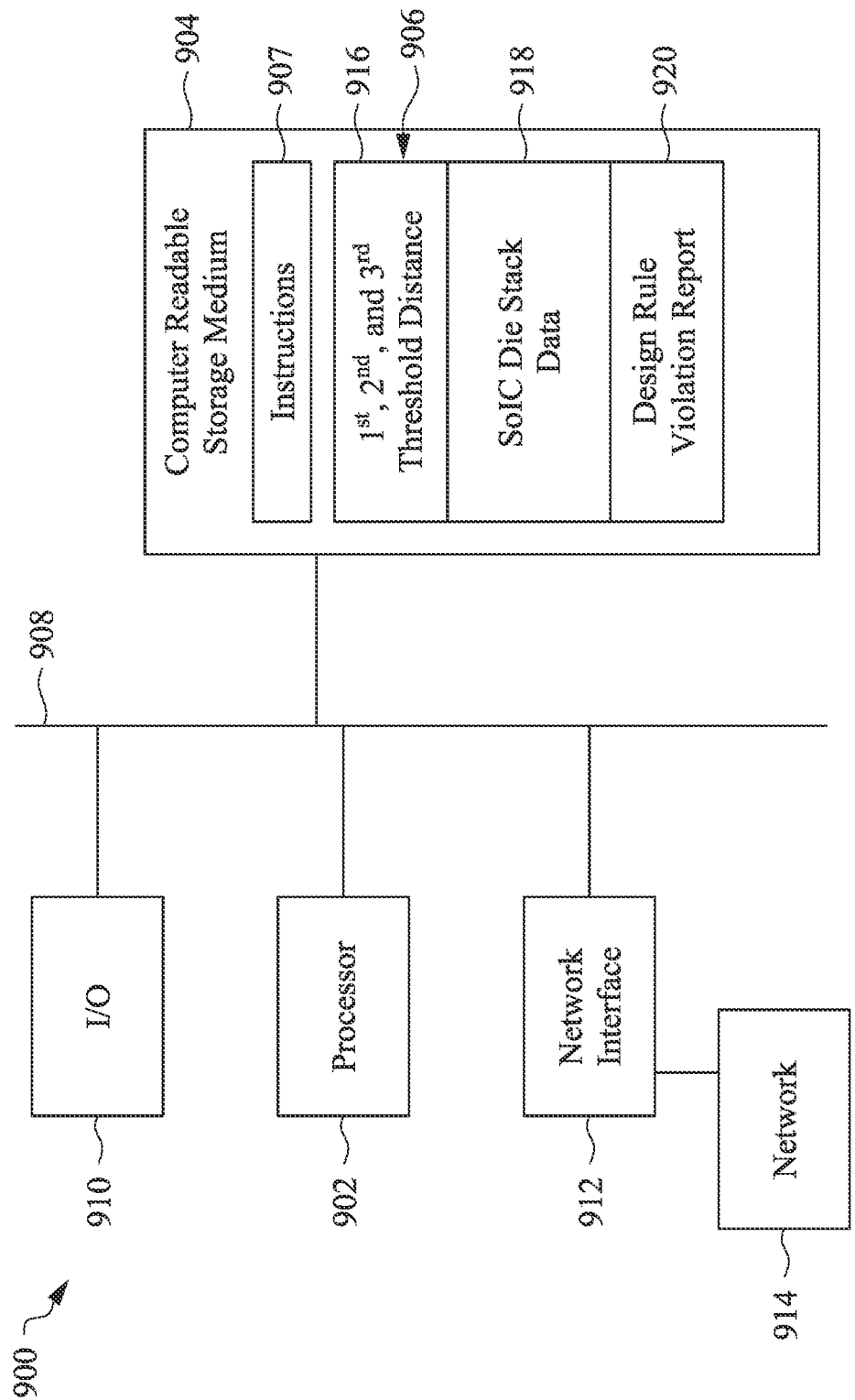
FIG. 9 is a schematic diagram of a specific purpose system for implementing a method of design rule check for a SoIC die stack in accordance with some embodiments.

FIG. 9 is a schematic diagram of a specific purpose system 900 for implementing a method of design rule check for a SoIC die stack in accordance with some embodiments. System 900 includes a hardware processor 902a, a non-transitory, computer readable storage medium 904 encoded with, i.e., storing, the computer program data 906, i.e., a set of program variables. Computer readable storage medium 904 is also encoded with instructions 907 for interfacing with other machines and for implementing a method of design rule check for a SoIC die stack (e.g., method 700 shown in FIG. 7). The processor 902 is electrically coupled to the computer readable storage medium 904 via a bus 908. The processor 902 is also electrically coupled to an I/O interface 910 by bus 908. A network interface 912 is also electrically connected to the processor 902 via bus 808. Network interface 912 is connected to a network 914, so that processor 902 and computer readable storage medium 904 are capable of connecting to external elements via network 914. The processor 902 is configured to execute the computer program data 906 or instructions 907 encoded in the computer readable storage medium 904 in order to cause system 900 to be usable for performing a portion or all of the operations as described in method 700 shown in FIG. 7. During execution of method 700, additional information is stored in or read from the computer readable storage medium 904, in some embodiments.

In some embodiments, the processor 902 is a central processing unit (CPU), a multi-processor, a distributed processing system, an application specific integrated circuit (ASIC), and/or a suitable processing unit.

In some embodiments, the computer readable storage medium 904 is an electronic, magnetic, optical, electromagnetic, infrared, and/or a semiconductor system (or apparatus or device). For example, the computer readable storage medium 904 includes a semiconductor or solid-state memory, a magnetic tape, a removable computer diskette, a random access memory (RAM), a read-only memory (ROM), a rigid magnetic disk, and/or an optical disk. In some embodiments, the computer readable storage medium 904 includes an optical disk, such as a compact disk-read only memory (CD-ROM), a compact disk-read/write (CD-R/W), and/or a digital video disc (DVD).

In some embodiments, the computer readable storage medium 904 stores the computer program data 906 or instructions 907 configured to cause system 900 to perform method 700 shown in FIG. 7. In some embodiments, the computer readable storage medium 904 stores computer program data 906, which includes information needed for performing the method 700 shown in FIG. 7 as well as information generated during performing the method 700, such as the first threshold distance, the second threshold distance, and the third threshold distance (collectively, 916), SoIC die stack data 918, a design rule violation report 920.

In some embodiments, the computer readable storage medium 904 stores instructions 907 for interfacing with manufacturing machines. The instructions 907 enable processor 902 to generate manufacturing instructions readable by the manufacturing machines to effectively implement method 700 shown in FIG. 7. During execution of method 700, additional information is stored in or read from computer readable storage medium 904, in some embodiments.

System 900 includes I/O interface 910. I/O interface 910 is coupled to external circuitry. In some embodiments, I/O interface 910 includes a keyboard, keypad, mouse, trackball, trackpad, and/or cursor direction keys for communicating information and commands to processor 902.

System 900 also includes network interface 912 coupled to the processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interface such as ETHERNET, USB, or IEEE-1394.

System 900 is a specific purpose computing device which is configured for executing method 700 shown in FIG. 7. While system 900 may include components which are usable in other computing devices, system 900 is configured for the specific purpose of executing a method of design rule check for an SoIC die stack.

Figure 10:
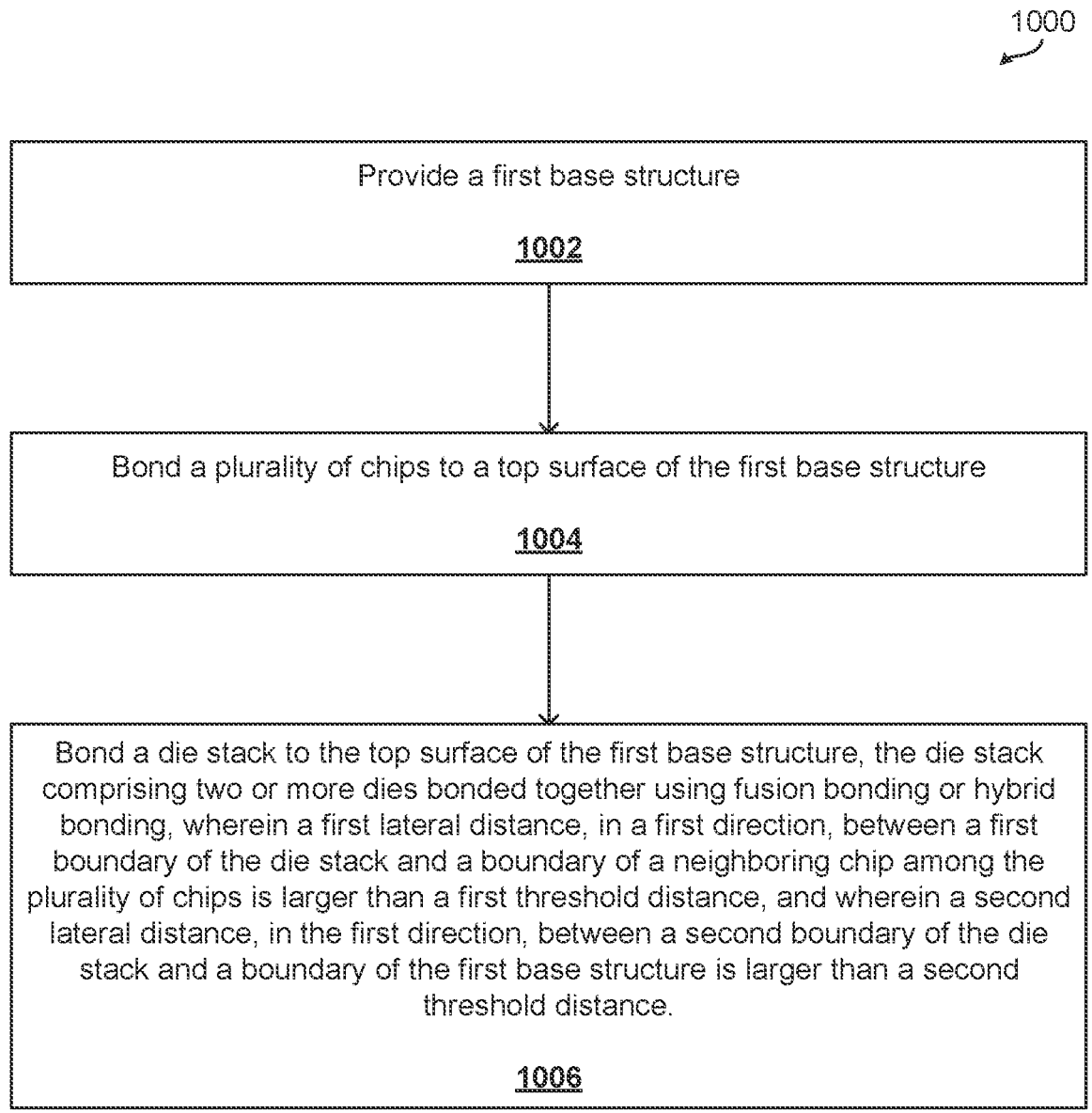
FIG. 10 is a flowchart illustrating an example method for fabricating a semiconductor package in accordance with some embodiments.

FIG. 10 is a flowchart illustrating an example method 1000 for fabricating a semiconductor package in accordance with some embodiments. In the example shown in FIG. 10, the method 1000 includes operations 1002, 1004, and 1006. Additional operations may be performed. Also, it should be understood that the sequence of the various operations discussed above with reference to FIG. 10 is provided for illustrative purposes, and as such, other embodiments may utilize different sequences.

At operation 1002, a first base structure is provided. In one embodiment, the first base structure is an interposer (e.g., the interposer 102 shown in FIG. 5).

At operation 1004, a plurality of chips (e.g., the chips 106$h$, 106$i$, and 106$j$ shown in FIG. 5) are bonded to a top surface of the first base structure. In one embodiment, the plurality of chips are bonded to the top surface of the first base structure using micro-bumps.

At operation 1006, a die stack (e.g., the SoIC die stack 104 shown in FIG. 5) is bonded to the top surface of the first base structure. The die stack includes two or more dies (e.g., the bottom die 204 and the top die 206 shown in FIG. 5) bonded together using fusion bonding or hybrid bonding. A first lateral distance (e.g., a1 shown in FIG. 5), in a first direction, between a first boundary of the die stack and a boundary of a neighboring chip among the plurality of chips is larger than a first threshold distance. A second lateral distance (e.g., a2 shown in FIG. 5), in the first direction, between a second boundary of the die stack and a boundary of the first base structure is larger than a second threshold distance. In one embodiment, the first threshold distance is 30 µm, and the second threshold distance is 50 µm.

It should be noted that the method 1000 may include other operation(s) in other embodiments. For instance, at another operation, the first base structure is bonded to a top surface of a second base structure. In one embodiment, the second base structure is a package substrate (e.g., the package substrate 101 shown in FIG. 5). A third lateral distance (e.g., a3 shown in FIG. 5), in the first direction, between the second boundary of the die stack and a boundary of the second base structure is larger than a third threshold distance. In one embodiment, the third threshold distance is 80 µm.

In accordance with some aspects of the disclosure, a semiconductor package is provided. The semiconductor package includes: an interposer; a System on Integrated Chips (SoIC) die stack bonded to a top surface of the interposer, the SoIC die stack comprising two or more dies bonded together; and a plurality of chips bonded to the top surface of the interposer. A first lateral distance, in a first direction, between a first boundary of the SoIC die stack and a boundary of a neighboring chip among the plurality of chips is larger than a first threshold distance.

In accordance with some aspects of the disclosure, a semiconductor package is provided. The semiconductor package includes: a first base structure; a die stack bonded to a top surface of the first base structure, the die stack comprising two or more dies bonded together using fusion bonding or hybrid bonding; and a plurality of chips bonded to the top surface of the first base structure. A first lateral distance, in a first direction, between a first boundary of the die stack and a boundary of a neighboring chip among the plurality of chips is larger than a first threshold distance.

In accordance with some aspects of the disclosure, a method is provided. The method includes: providing a first base structure; bonding a plurality of chips to a top surface of the first base structure; and bonding a die stack to the top surface of the first base structure. The die stack includes two or more dies bonded together using fusion bonding or hybrid bonding. A first lateral distance, in a first direction, between a first boundary of the die stack and a boundary of a neighboring chip among the plurality of chips is larger than a first threshold distance. A second lateral distance, in the first direction, between a second boundary of the die stack and a boundary of the first base structure is larger than a second threshold distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
an interposer;
a System on Integrated Chips (SoIC) die stack bonded to a top surface of the interposer, the SoIC die stack comprising two or more dies bonded together; and
a plurality of chips bonded to the top surface of the interposer; and
wherein a first lateral distance, in a first direction, between a first boundary of the SoIC die stack and a boundary of a neighboring chip among the plurality of chips is larger than a first threshold distance;
wherein a second lateral distance, in the first direction, between a second boundary of the SoIC die stack and a boundary of the interposer is larger than a second threshold distance.

2. The semiconductor package of claim 1 further comprising:
a first package substrate, wherein the interposer is bonded to a top surface of the first package substrate, and wherein a third lateral distance, in the first direction, between the second boundary of the SoIC die stack and a boundary of the first package substrate is larger than a third threshold distance.

3. The semiconductor package of claim 2 further comprising:
a second package substrate, wherein the first package substrate is bonded to a top surface of the second package substrate, and wherein a fourth lateral distance, in the first direction, between the second boundary of the SoIC die stack and a boundary of the second package substrate is larger than the third lateral distance.

4. The semiconductor package of claim 2, wherein the third threshold distance is 80 µm.

5. The semiconductor package of claim 1, wherein the two or more dies are bonded together using hybrid bonding.

6. The semiconductor package of claim 1, wherein the two or more dies are bonded together using fusion bonding.

7. The semiconductor package of claim 1, wherein the SoIC die stack is bonded to the interposer using hybrid bonding.

8. The semiconductor package of claim 1, wherein the SoIC die stack is bonded to the interposer using fusion bonding.

9. The semiconductor package of claim 1, wherein the plurality of chips are bonded to the interposer using microbumps.

10. The semiconductor package of claim 1, wherein the first threshold distance is 30 µm.

11. The semiconductor package of claim 1, wherein the second threshold distance is 50 µm.

12. The semiconductor package of claim 1, wherein the neighboring chip is one of a logic chip, a memory chip, a computation chip, a sensor chip, a radio frequency (RF) chip, or a high voltage (HV) chip.

13. The semiconductor package of claim 1, wherein the SoIC die stack comprises a top die, a middle die, and a bottom die bonded together.

14. The semiconductor package of claim 1, wherein at least one die in the SoIC die stack comprises a seal ring configured to prevent intrusion of cracks and moisture.

15. A semiconductor package comprising:
a first base structure;
a die stack bonded to a top surface of the first base structure, the die stack comprising two or more dies bonded together using fusion bonding or hybrid bonding; and
a plurality of chips bonded to the top surface of the first base structure; and
wherein a first lateral distance, in a first direction, between a first boundary of the die stack and a boundary of a neighboring chip among the plurality of chips is larger than a first threshold distance;
wherein a second lateral distance, in the first direction, between a second boundary of the die stack and a boundary of the first base structure is larger than a second threshold distance.

16. The semiconductor package of claim 15 further comprising:
a second base structure, wherein the first base structure is bonded to a top surface of the second base structure, and wherein a third lateral distance, in the first direction, between the second boundary of the die stack and a boundary of the second base structure is larger than a third threshold distance.

17. The semiconductor package of claim 16 further comprising:
a third base structure, wherein the second base structure is bonded to a top surface of the third base structure, and wherein a fourth lateral distance, in the first direction, between the second boundary of the die stack and a boundary of the third base structure is larger than the third lateral distance.

18. The semiconductor package of claim 15, wherein the first base structure is an interposer.

19. A semiconductor package comprising:
an interposer;
a System on Integrated Chips (SoIC) die stack bonded to a top surface of the interposer, the SoIC die stack comprising two or more dies bonded together; and
a plurality of chips bonded to the top surface of the interposer, the plurality of chips comprising a first chip, the first chip being a neighboring chip of the SoIC die stack, wherein a first lateral distance, in a first horizontal direction, between a first boundary of the SoIC die stack and a boundary of the first chip is larger than a first threshold distance;

wherein a second lateral distance, in the first horizontal direction, between a second boundary of the SoIC die stack and a boundary of the interposer is larger than a second threshold distance, the second boundary of the SoIC die stack being opposite to the first boundary of the SoIC die stack.

20. A semiconductor package of claim 19, wherein the first threshold distance is 30 μm.

* * * * *